(12) United States Patent
Javey et al.

(10) Patent No.: US 7,655,272 B1
(45) Date of Patent: Feb. 2, 2010

(54) NANOPARTICLES WITH CONTROLLED GROWTH

(75) Inventors: Ali Javey, Berkeley, CA (US); Hongjie Dai, Cupertino, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 475 days.

(21) Appl. No.: 11/437,278

(22) Filed: May 19, 2006

(51) Int. Cl.
*B05D 1/32* (2006.01)

(52) U.S. Cl. .................. 427/123; 427/250; 427/282; 427/383.1; 977/810

(58) Field of Classification Search ............. 427/282, 427/123, 249.9, 250, 383.1, 977; 977/810
See application file for complete search history.

(56) References Cited

U.S. PATENT DOCUMENTS

| | | | |
|---|---|---|---|
| 6,500,497 B1 * | 12/2002 | Wang et al. ............ | 427/528 |
| 6,579,463 B1 * | 6/2003 | Winningham et al. ...... | 216/41 |
| 6,835,591 B2 * | 12/2004 | Rueckes et al. ........... | 438/99 |
| 7,094,654 B2 * | 8/2006 | Rohlfing ................. | 438/304 |
| 7,267,859 B1 * | 9/2007 | Rabin et al. ............. | 428/131 |
| 2002/0172820 A1 * | 11/2002 | Majumdar et al. ........ | 428/357 |
| 2005/0224779 A1 * | 10/2005 | Wang et al. .............. | 257/9 |
| 2005/0287717 A1 * | 12/2005 | Heald et al. ............. | 438/128 |
| 2006/0207647 A1 * | 9/2006 | Tsakalakos et al. ...... | 136/256 |
| 2008/0050747 A1 * | 2/2008 | Korlach et al. ........... | 435/6 |

OTHER PUBLICATIONS

Drodofsky, U., et al., "Hexagonal nanostructures generated by lights mask for neutral atoms," Appl. Phys. B 65, 755-759 (1997).*
Jeon, Seokwoo, et al., Fabricating complex three-dimensional nanostructures with high-resolution conformable phase masks. PNAS, vol. 101 No. 34, 12428-12433, Aug. 24, 2004.*
D. Wang; R. Tu; L. Zhang, H. Dai. "Deterministic One-to-One Synthesis of Germanium Nanowires and Individual Gold Nanoseed Patterning for Aligned Nanowire Arrays." *Angewandte Chemie International Edition*. May 6, 2005 (e-publication Apr. 7, 2005). vol. 44, pp. 2925-2929.

* cited by examiner

*Primary Examiner*—Bret Chen
(74) *Attorney, Agent, or Firm*—Crawford Maunu PLLC (57) ABSTRACT

Nanostructures are implemented in a manner that facilitates controlled, nano-scale dimensional manufacture and implementation. According to an example embodiment of the present invention, a nanostructure is formed from a layer of deposited metallic material, sized using a mask and, in some applications, metal deposition angle. The deposited metallic material is heated to form a metallic nanocluster having a cross-section (e.g., diameter-type or width-type dimensional characteristics) that is less than a width of the layer of deposited metal material. In one application, the metallic material is deposited on a substrate and in wells defined by a mask formed on the substrate. The metallic material is annealed to form metallic nanoclusters having a diameter that is on an order of magnitude less than a width and/or diameter of the wells.

20 Claims, 7 Drawing Sheets

NANOPARTICLES WITH CONTROLLED GROWTH

FIELD OF THE INVENTION

The present invention relates generally to small-scale structures and, more particularly, to the formation of nano-scale particles such as nanoclusters.

BACKGROUND

Nanoparticles and nano-scale structures having size characteristics ranging down to the nanometer-range (e.g., having diameter, width or height characteristics that are less than 100 nanometers) have been the focus of a wide range of studies, owing to their interesting physical and chemical properties and broad applications in catalysis, surface science, materials science, medical fields, electronics and others. For instance, nanostructures such as metal clusters, nanotubes, nanowires, circuits and others have been the subject of research and implementation for a variety of applications.

In many applications, nanoparticles are formed for direct implementation with structures, or as a building block for larger structures and/or for the growth of nanostructures. Often, these nanoparticles are desirably formed with controllable sizes down to molecular dimensions. In addition, individual nanoparticles or clusters of nanoparticles are often desirably positioned on supporting structures such as substrates.

Some approaches to the manufacture of nanostructures involve the self-assembly of nanoparticles. Such self-assembly methods have afforded relatively small nanoparticles with packed or connected structures. However, many self-assembly approaches have been limited in application, relative to very small-scale (e.g., sub-20 nm) nanostructures. For instance, photolithography is one approach that has been useful in the manufacture of nano-scale particles, yet is difficult to implement at relatively small scale (e.g., sub-20 nm or sub-10 nm).

The above-mentioned and other factors have presented challenges to the production of nanostructures and to their integration with a variety of applications, such as those involving electronic, structural, medical and other devices.

SUMMARY OF THE INVENTION

The present invention is directed to overcoming the above-mentioned challenges and others related to nanostructures and their implementation. The present invention is exemplified in a number of implementations and applications, some of which are summarized below.

In one example embodiment of the present invention, an array of metal nanoclusters is formed on a substrate. The substrate is masked, the mask is patterned, and a layer of metal is deposited on exposed portions of the substrate at patterned openings in the mask layer. The metal is heated to a temperature to facilitate the clustering of the metal, and form a nanocluster having a cross-sectional dimension (e.g., diameter) less than a lateral dimension (e.g., diameter) of the opening in the mask layer.

In some embodiments, openings in the mask layer are patterned at a diameter that is near a lithography limit for wafer-scale manufacture (e.g., at about 20 nm) and separated by a relatively small distance (e.g., less than about 100 nm). The metal nanoclusters are formed to a diameter of less than about 2 nm (i.e., on an order of magnitude less than the diameter of the opening in the mask layer).

In certain embodiments, the layer of metal is deposited at an angle, relative to the substrate, using the mask to mask a portion of the substrate exposed via the openings. The layer of metal is thus formed with a lateral dimension that is less than a lateral dimension (e.g., diameter) of the openings.

According to another example embodiment of the present invention, an array of nanostructures is formed on a substrate. A masking layer is formed on the substrate and an array of openings is patterned in the masking layer to expose the substrate below the masking layer. A layer of metallic material is deposited on the exposed substrate at each opening. The metallic layer is annealed to form metallic nanoclusters at each opening, each nanocluster having a cross-sectional dimension that is on an order of magnitude less than the lateral dimension of the opening in which the nanocluster is formed. An array of nanostructures, such as an array of nanotubes or nanowires, is grown from the metallic nanoclusters.

According to another example embodiment of the present invention, an array of nanostructures is grown from a number of nanoclusters with selected diameter formed at each of a plurality of nanocluster sites. A masking layer is formed on a substrate, and an array of wells is patterned in the masking layer to expose the substrate below, each opening having a diameter determined as a function of the selected number of nanoclusters to be formed at the opening. A layer of metallic material is deposited on a portion of the exposed substrate at each well, using the masking layer with an angle of deposition to selectively mask a portion of the exposed substrate at each well. The masking layer is removed and the metallic layer is heated (e.g., annealed) to form metallic nanoclusters. Nanostructures are grown from the metallic nanoclusters.

In another example embodiment, nanoclusters are manufactured from a metallic nanocluster. A layer of metallic material is deposited at nanocluster sites defined on a substrate, using a mask over the substrate and an angle of deposition of the metallic material to define a lateral dimension of the metallic material layer. The nanomaterial layer is annealed to form, at each nanocluster site, at least one nanocluster having a diameter that is an order of magnitude smaller than the defined lateral dimension of the metallic material layer.

The above summary of the invention is not intended to describe each illustrated embodiment or every implementation of the present invention. The figures and detailed description that follow more particularly exemplify these example embodiments.

BRIEF DESCRIPTION OF THE DRAWINGS

The invention may be more completely understood in consideration of the detailed description of various embodiments of the invention that follows in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be applicable to a variety of different types of nanostructures and nanostructure devices, and the invention has been found to be particularly suited for manufacturing nanostructures with controllable position and sizes. While the present invention is not necessarily limited to such applications, various aspects of the invention may be appreciated through a discussion of various examples using this context.

According to an example embodiment of the present invention, individual metallic nanoclusters (e.g., particles or nanoparticles) are formed to a selected size, and in some applications, to monodisperse sizes on about a 2-nanometer scale. One or more nanocluster sites are created on a substrate or other material, with metallic material formed at each site (e.g., as a layer or coating). The sites are heat-treated to facilitate the manipulation of the metallic material into one or more nanoparticle clusters at the site.

In some embodiments, the nanocluster sites are formed using a patterning approach such as photolithography to create a masking layer of material having distinct openings (e.g., wells) over a substrate, with each opening corresponding to a particular nanocluster site. The metallic material is formed on the substrate in the openings, the material having dimensional characteristics defined by the openings, and a thickness selected for the particular application. The metallic material is then heated to form metallic nanoclusters, each nanocluster having a general diameter (e.g., thickness or other cross-sectional dimension) that is smaller than the openings. The metallic nanoclusters are selectively formed to a diameter or thickness that is on an order of magnitude smaller than a width dimension of the opening in which it was formed.

In general, the two-dimensional diameter or width of the metallic material sets the number of metallic nanoclusters formed at each nanocluster site, such that the number of nanoclusters can thus be selected via the diameter or width of the metallic material. In certain applications, the size of the openings is used to set the number of metallic nanoclusters to be formed at each nanocluster site. In other applications, a combination of the size of the openings, the height of the masking material and the angle of deposition of the metallic material is used to set diameter or width of the metallic material (and, correspondingly, the number of metallic nanoclusters formed).

In some implementations, nanoclusters are patterned into arrays or other spatial arrangements using a patterning technique such as electron-beam lithography. Openings are formed in a patterned material (e.g., a photoresist mask) to define the array or other spatial arrangement. In some applications, the openings have relatively high resolution, such as circular or polygonal openings having a diameter or width-dimension that is less than about 20 nanometers. A layer of metallic material is formed in the openings, taking the general shape (e.g., diameter or width) of the openings. When subsequently heated, the layer of metallic material draws together into a spherical-type of nanocluster, having a general diameter that is on an order of magnitude (e.g., ten times) smaller than the diameter or width of the openings.

In applications involving the formation of a layer of the metallic material, the thickness of the layer is selectively used to set the diameter of a nanocluster or nanoclusters formed at a particular nanocluster site. For instance, referring to the patterning example above, the thickness of metallic material formed at each site is used to determine the diameter of each nanocluster. In this regard, the diameter of the nanoclusters can be selected and implemented via the thickness of the metallic material deposited at the nanocluster sites.

In general, the discussed metallic nanoclusters refer to any material and/or shape having a nano-scale dimension (e.g., less than about 100 nm diameter or thickness), as one or more of a solid, composite, metal, semiconducting or other material. The metallic nanoclusters can further be used in one or more of a variety of applications, such as electrical, chemical, mechanical or biological applications. In some applications, the metallic nanoclusters are used to form larger structures (e.g., nanostructures), such as for the catalytic synthesis of nanotubes, such as single-walled carbon nanotubes (SWNT), multi-walled carbon nanotubes (MWNT) or semiconducting nanowires. In various contexts, the term nanostructures generally refers to nanotubes or nanowires that are grown via metallic nanoclusters.

In one particular application, SWNTs are grown from metallic nanoclusters formed as described above. Openings are patterned in a mask at locations at which SWNTs are to be grown, and at least one metallic nanocluster is formed at each opening as described, for example, in connection with one or more of the approaches above. The resulting metallic nanoclusters form a pattern (e.g., an array), and in some applications, are formed having a generally spherical shape with a diameter of less than about 5 nm, or less than about 2 nm. A chemical vapor deposition (CVD) approach is used to introduce a nanotube material to the metallic nanoclusters that catalyze the growth of SWNTs from the introduced material.

In one particular application, carbon nanotubes are grown from metallic nanoclusters. The metallic nanoclusters are formed of a catalyst material that facilitates carbon nanotube growth, such as an iron catalyst. The nanotube material is a carbon-containing gas, which is introduced to the catalyst nanoclusters. Carbon SWNTs are grown at a majority of the catalyst nanoclusters, forming an array or other pattern of the SWNTs at well defined locations.

The materials implemented with the substrate, metallic material and mask (where appropriate) are selected using one or more of a variety of criteria, and in some applications, are selected to facilitate the formation of desirable metallic nanoclusters. In one particular embodiment, a substrate upon which metallic material is formed exhibits finite mobility and metal diffusion characteristics that facilitate the formation of stationary clusters of the metallic material upon heating. For instance, $SiO_2$ or $Si/SiO_2$ is used in one such application, with a mask (e.g., PMMA) having openings formed thereon. Other substrates such as quartz, aluminum oxide and other types of ceramics are used with other example embodiments. Metallic material is formed on the substrate in the openings. Upon heating, diffuse metal atoms on the substrate hit and stick to each other via metal-metal interactions, forming metallic nanoclusters.

Turning now to the Figures, FIGS. 1A-1D show cross-sectional views of a nanocluster array arrangement 100 at various stages of manufacture, according to another example embodiment of the present invention. Beginning with FIG. 1A, a masking layer 120 is shown patterned onto a substrate 110 using a patterning approach such as electron beam lithography or nanoimprinting lithography. As discussed above, the substrate may include, for example, one or more of quartz, aluminum oxide, ceramics or $SiO_2$. Openings 122, 124 and 126 are formed in the masking layer 120, exposing a portion of the substrate 110 at selected locations and therein defining nanocluster sites. The width of each opening, with the width of opening 122 shown marked as "W" by way of example, is selected to set the number of metallic nanoclusters to be formed at each site defined by the openings, and in some applications, having circular-type lateral dimensions of between about 5 nm and 50 nm. By way of example, openings 122, 124 and 126 are shown sized progressively larger, each sized to form increasing numbers of metallic nanoclusters as discussed in the following.

Figure 1A:
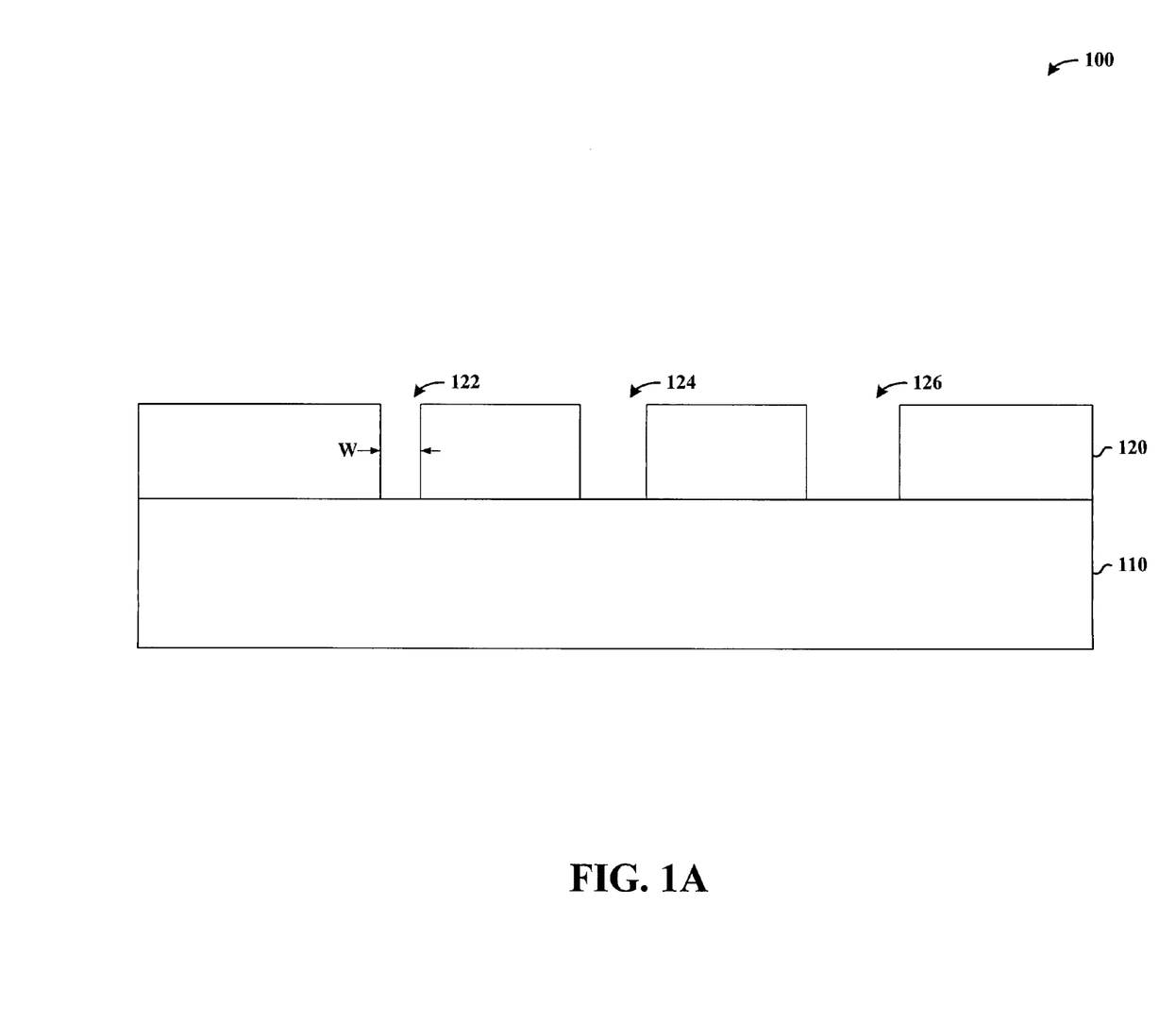
FIGS. 1A-1D show cross-sectional views of a nanocluster array arrangement at various stages of manufacture, according to an example embodiment of the present invention.
Figure 1B:
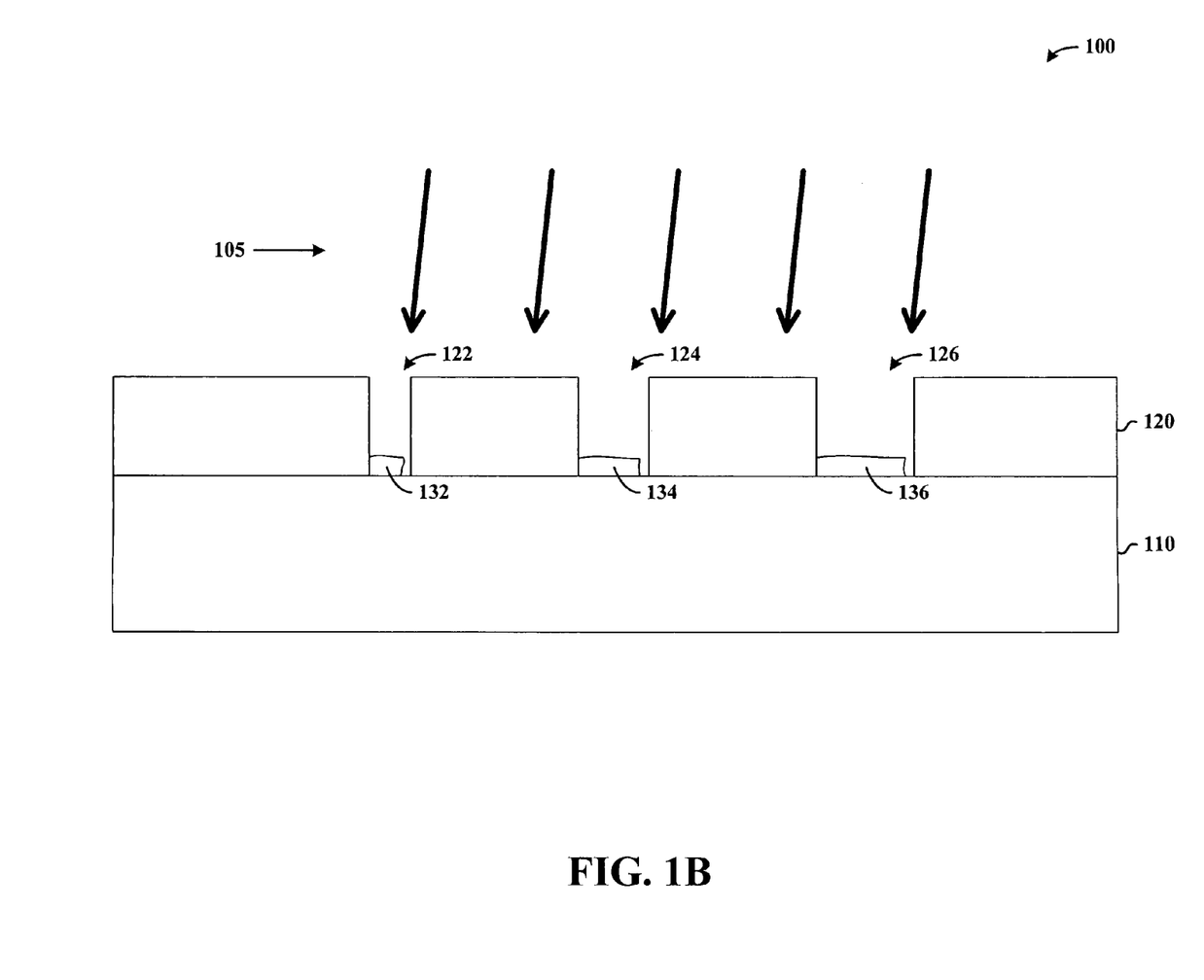

At FIG. 1B, a layer of metallic material is formed at each nanocluster site, using an angled evaporation as represented by the series of arrows marked 105. Here, metallic material portions 132, 134 and 136 are formed at openings 122, 124 and 126, respectively. The thickness of the metallic material portions is selected to achieve a desired diameter or general thickness of metallic nanoclusters to be formed, with the amount and corresponding thickness controlled using, for example, thickness monitoring approaches during the evaporation.

The lateral dimension of the metallic material at each nanocluster site is controlled to set the number of metallic nanoclusters to be formed at each nanocluster site, using the angle, width of the openings and height of the masking layer 120. For example, referring to the nanocluster site at opening 124 by way of example, the angle of evaporation of the metallic material and the height of the mask 120 is used to set the lateral width of the metallic portion 134. Here, the angle of evaporation represented by arrows 105, together with the height of the masking layer 120, facilitate the formation of the metallic material 134 generally to the left of the opening 124 and having a lateral offset on the right portion of the opening.

Figure 1C:
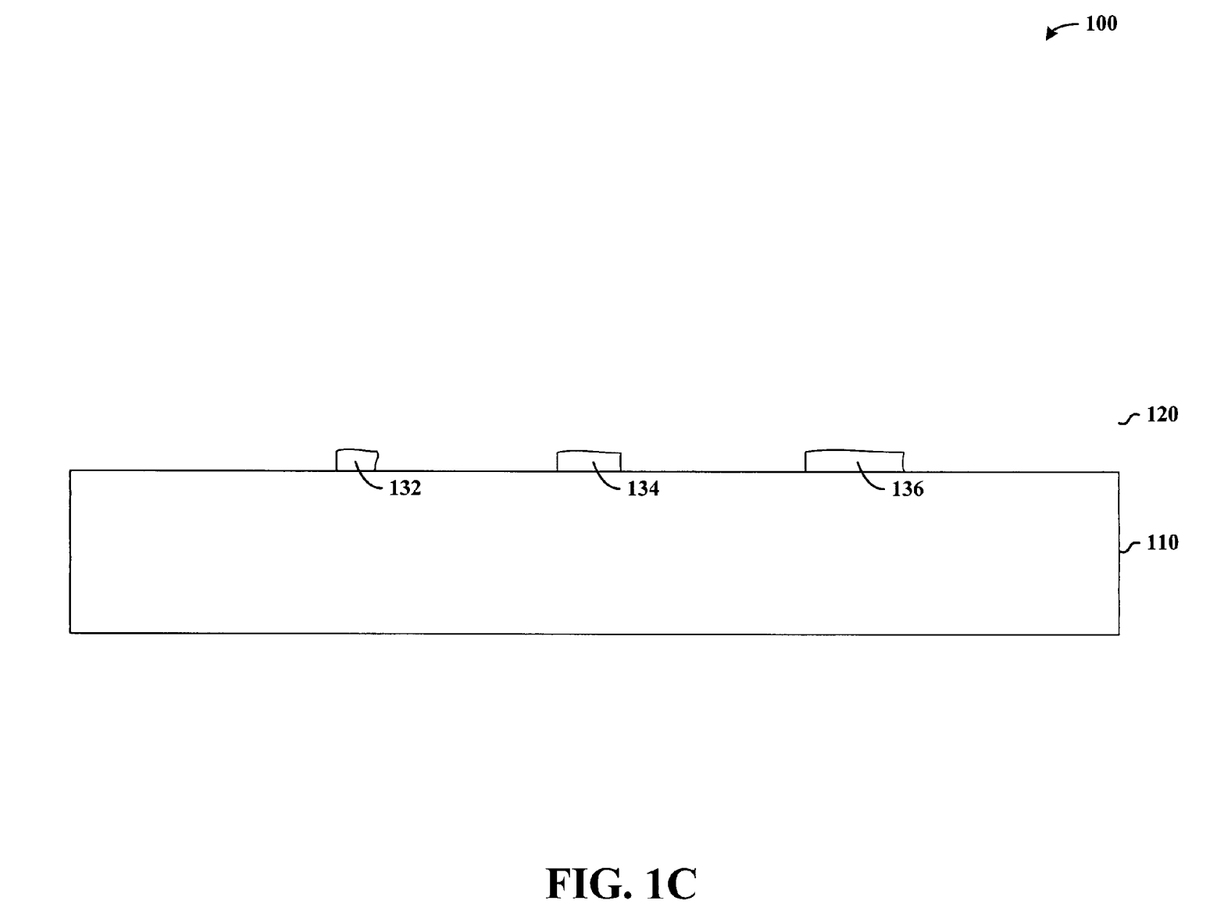
Figure 1D:
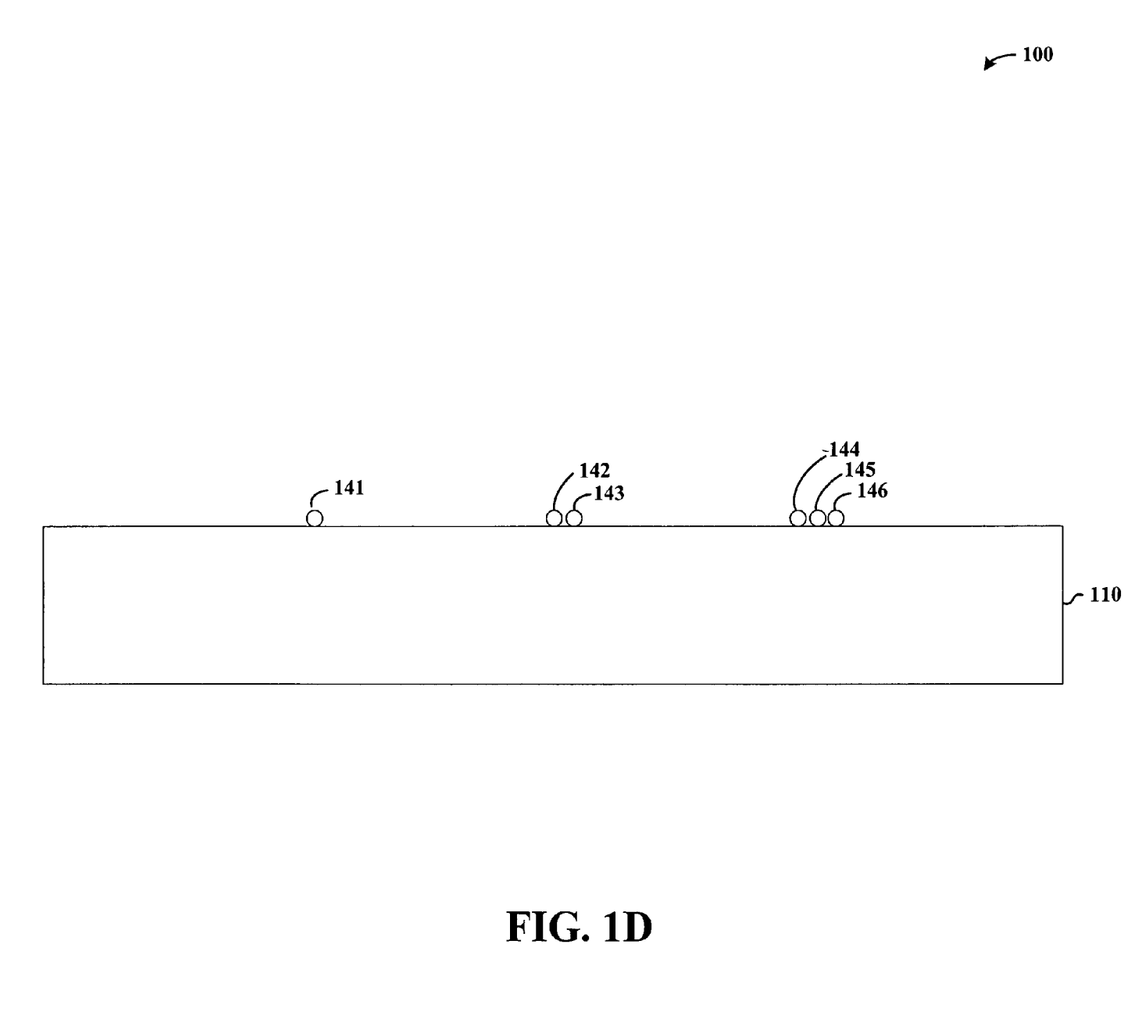

After metallic material has been formed at the nanocluster sites defined by openings 122, 124 and 126, the masking layer 120 is removed, leaving the metallic material portions 132, 134 and 136 behind as shown in FIG. 1C. The nanocluster array arrangement 100 is then heated (e.g., annealed) to cause the metallic material at each nanocluster site to interact and form metallic nanoclusters 141-146 as shown in FIG. 1D. As discussed above, the width of each of the openings 122, 124 and 126 set as shown in FIG. 1A is selected to achieve a desired number of nanoclusters at each nanocluster site. Here, groups of one, two and three nanoclusters are respectively formed at nanocluster sites defined by openings 122, 124 and 126.

With this approach, nanoclusters are formed to a selectable diameter, ranging from one or two nanometers to tens of nanometers, while the associated patterning needs not necessarily reach similar dimensional limits. For instance, patterning 2 nm wells can be much more difficult than patterning 20 nm wells yet nanoclusters with 2 nm diameters can be realized with this approach. Furthermore, the nanoclusters are formed at specified locations with a selected number of nanoclusters at each location, which can be selected for different applications of the nanoclusters, such as for assembly, further processing and/or forming other materials such as nanowires or nanotubes.

The approach discussed above in connection with FIGS. 1A-1D is applicable to implementation with a variety of substrates, masks and metallic materials, as well as a variety of resulting metallic nanocluster sizes, shapes and quantity per nanocluster site. The following discussion describes one such particular example, in reference to FIGS. 1A-1D, using reference numbers corresponding to those shown in the figures.

In one application, a layer of polymethyl methacrylate (PMMA) (e.g., 120) is formed on a Si/SiO2 (10 nm) substrate (e.g., 110) to a thickness of about 100 nm. Wells with a radius "r" of about 20 nm are patterned in the PMMA using electron beam lithography, exposing portions of the substrate at selected nanocluster locations.

A thin film (e.g., between about 2-20 Å) of a metal such as Cobalt (Co), Iron (Fe), Gold (Au) or Platinum (Pt) is evaporated at an angle of about 5-10° with respect to the substrate normal (e.g., as shown with arrows 105 in FIG. 1B) to form metal layer portions at each well, such as shown with metallic material portion 132. The PMMA is then removed via lift-off, and the evaporated metal layer is thermally annealed at a temperature of between about 700-900° C. The annealing forms discrete clusters of metal nanoclusters from the evaporated metal in an arrayed fashion as defined by the wells.

In some applications involving a $SiO_2$ type of substrate as discussed above, metallic nanoclusters having a diameter about 2 nm are formed in wells in PMMA having a diameter of about 20 nm. The $SiO_2$ facilitates finite mobility and diffusion of metal atoms at high temperatures during the aforesaid annealing process; deposited (originally dispersed) metal atoms irreversibly "hit and stick" to each other via metal-metal interactions and eventually, forming stationary clusters.

In some applications, the number of metal atoms deposited in each well is limited to set the diameter of the resulting nanoclusters, such as those shown in FIG. 1D. For example, by limiting the number of atoms deposited in each well to about 500 atoms per well, metallic nanoclusters to about a 2 nm diameter can be formed. The mean diffusion distance, $l_{diff}$, can be approximated by the Einstein relation, $$l_{diff} \propto D \propto \exp(-E_{diff}/2K_B T),$$

wherein

D is the diffusion coefficient, $E_{diff}$ is the diffusion activation energy from site to site, $K_B$ is the Boltzmann constant, and T is temperature at which thermal annealing is carried out.

For any given metal, clustering of atoms takes place within a radius of $r \sim l_{diff}$ and is temperature-dependent as indicated in the Einstein relation above. With this approach, and using relatively high temperatures to enhance diffusion and $l_{diff}$, metallic nanoclusters are formed to a selected diameter and of a selected quantity at a particular site. Each site (e.g., a well or patterned opening) is formed to a selected size in accordance with the temperature and material to be used in accordance with the Einstein relation.

Figure 2A:
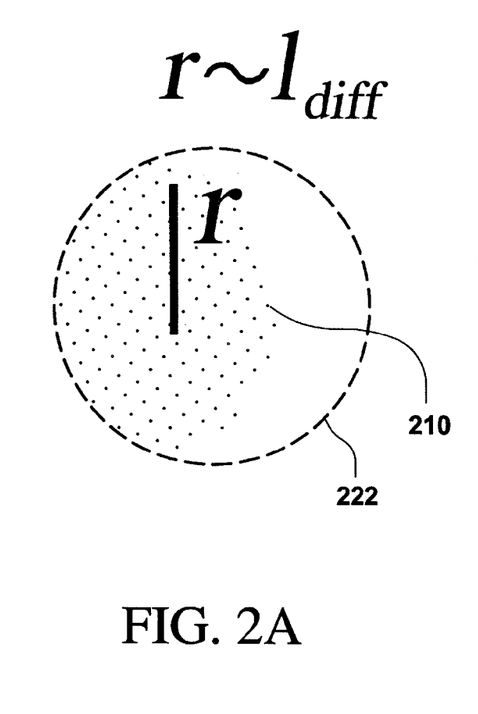
FIGS. 2A and 2B show a top-down view of an approach to forming nanoclusters from metal films, according to another example embodiment of the present invention.

FIGS. 2A and 2B show an approach to forming nanoclusters from metal films in accordance with such an approach, approximating $l_{diff}$ and using the approximation to facilitate the determination of the number and size of nanoclusters at a particular well location, according to another example embodiment of the present invention. FIG. 2A shows a metallic material 210 deposited in a well 222, shown from a generally top-down view with the well represented by dashed lines and corresponding, for example, to a well similar to the opening 122 shown in FIG. 1A. A radius-type dimension "r" of the layer of deposited metallic material 210 is set to $r \sim l_{diff}$, and is generally amenable to reference with a non-circular as well as circular shape (here shown with the metallic material as a generally oval shape), depending upon the orientation of the well and the angle of deposition of the metallic material.

Figure 2B:
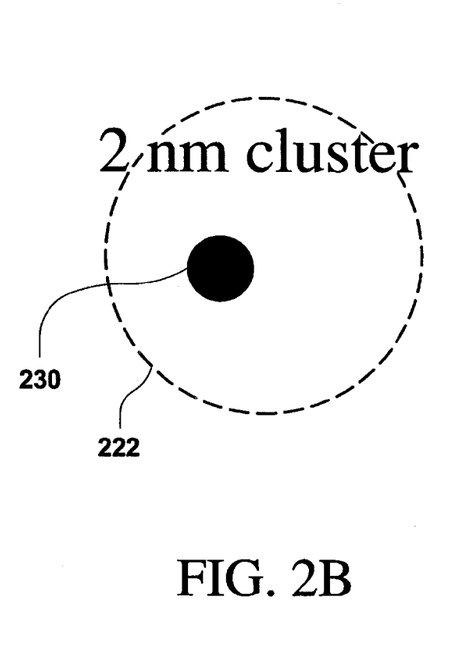

The metallic material in FIG. 2A is annealed to form a nanocluster 230 in the well 222, as shown in FIG. 2B. This nanocluster 230 has a diameter of about 2 nm, which is on an order of magnitude less than the diameter of the metallic material 210 (e.g., about 2 r/10, where the r is about 10 nm).

In the above example, r~$l_{diff}$, facilitating the growth of one nanocluster; however, growth of two or more nanoclusters is facilitated with larger deposited areas of metal material (e.g., metallic material 210). For instance, using the general relationship of r~$l_{diff}$ for forming a single nanocluster, wells or openings facilitating r≦$l_{diff}$ are implemented for depositing the metallic material. For growing more than one nanocluster, wells or openings facilitating r>$l_{diff}$ are implemented for depositing the metallic material. As discussed above, one or both of well/opening size and angle of deposition of the metal material can be used to achieve a desirable dimension r for the particular material being deposited.

As discussed above, a variety of metal materials are used for a variety of applications; annealing temperatures are selected to suit particular metals used. In one application, Cobalt (Co) is used with the deposited metal layer to form metal nanoclusters including Cobalt. For single nanocluster formation in wells having diameter of about 20 nm, an annealing temperature of about 825° C. is used. With wells greater than about 25 nm and at similar temperature, two or more Cobalt nanoclusters are formed. In another application, where Iron (Fe) and/or Platinum (Pt) are used with the deposited metal layer to form metal nanoclusters, an annealing temperature for individual <5 nm Iron and Platinum nanoclusters are respectively 775° C. and 900° C. At relatively lower annealing temperatures, multiple smaller particles may be formed per well due to incomplete aggregation; at relatively higher annealing temperatures, nanocluster size is reduced and/or disappear due to the evaporation of atoms.

Figure 3:
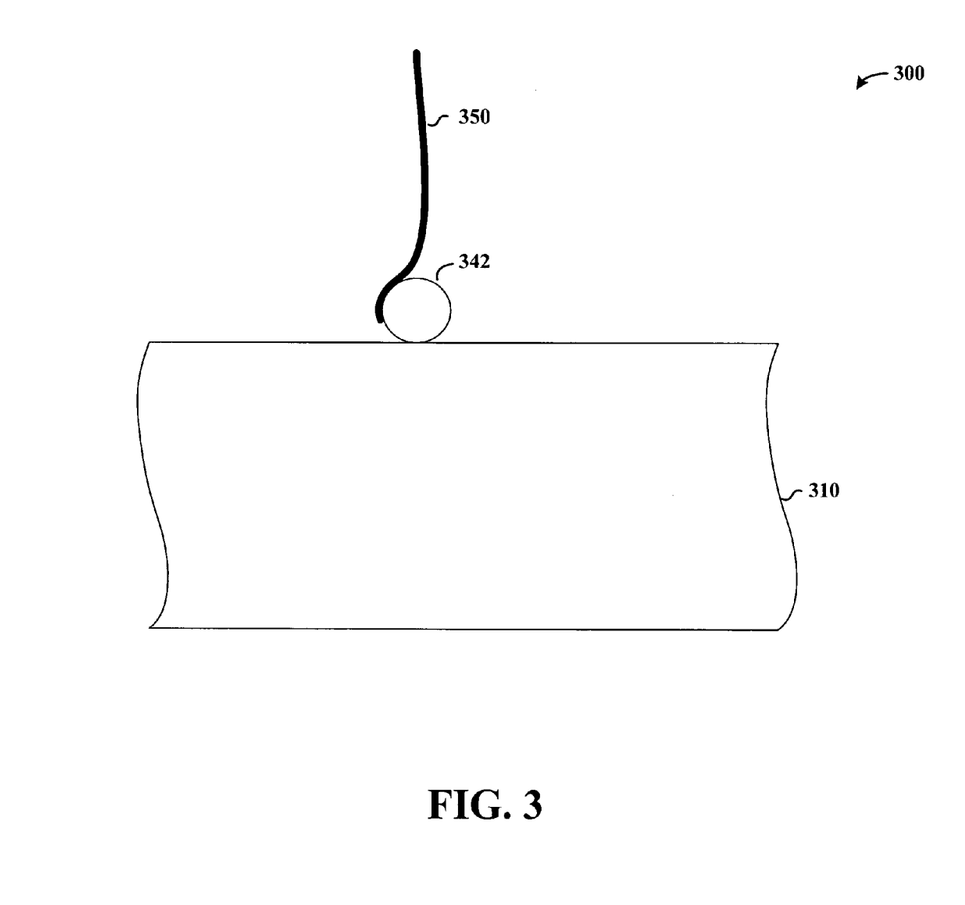
FIG. 3 shows a cross-sectional view of an arrangement for carbon nanotube growth, according to another example embodiment of the present invention.

FIG. 3 shows a cross-sectional view of an arrangement 300 for nanomaterial growth, according to another example embodiment of the present invention. Nanostructures that may be grown with this approach may include, for example, one or more of nanotubes and nanowires. In addition the nanostructures may include material such as carbon, germanium, boron or others. Such applications may involve, for example, the growth of carbon nanotubes such as single-walled nanotubes (SWNTs), germanium-containing nanowires and others. For simplicity, the following discussion made in connection with FIG. 3 references carbon nanotube growth; however, this discussion, approach and FIG. 3 itself are applicable to selective implementation with all of the above-discussed nanostructures and materials for various example embodiments.

A metallic catalyst nanocluster 342 is formed on a substrate 310, with only a portion of the substrate shown for illustrative purposes. The catalyst nanocluster 342 is formed using one or more of the approaches discussed above involving the patterning of thin layers of metal such as Cobalt or Iron, via CVD or other approach, and subsequent heating of the metal to form the nanocluster. The resultant catalyst nanocluster 342 has a diameter set by the amount of metal deposited, and in some applications, is between about 1-3 nm. While one catalyst nanocluster 342 is shown in FIG. 3, a multitude of such nanoclusters are selectively formed in an array such as that shown in FIG. 4 and discussed further below, or in another type of arrangement or pattern.

For carbon nanotube growth, a carbon-containing gas such as methane is introduced to the catalyst nanocluster 342, which facilitates the growth of a single-walled carbon nanotube 350, beginning at the catalyst nanocluster. The diameter of the single-walled carbon nanotube 350 corresponds to the diameter of the catalyst nanocluster 342, and in certain applications as discussed above, is between about 1-3 nm.

As discussed above, a variety of metals can be used with the catalyst nanocluster 342. In one application, Cobalt is used for the catalyst nanocluster 342. The carbon nanotube 350 is synthesized via CVD at 825° C. for 5 min with 300 sccm of Ar/H2 (3% $H_2$) passed through an ethanol source (maintained at about −10° C.). In another application, Iron is used for the catalyst nanocluster 342. The carbon nanotube 350 is synthesized via plasma-assisted CVD of methane at 700° C.

In another example embodiment, an approach similar to that discussed in connection with FIG. 3 is used to grow an array of Germanium nanowires using gold nanoclusters to catalyze the Germanium nanowire growth. The gold nanoclusters are formed using an approach similar to that described in connection with FIGS. 1A-1D. For general information regarding nanowires, and for specific information regarding approaches to growing Germanium nanowires made in accordance with one or more example embodiments of the present invention (using nanocluster growth), reference may be made to D. Wang, R. Tu, L. Zhang, H. Dai, "Deterministic One-to-one Synthesis of Germanium Nanowires and Individual Gold Nanoseed Patterning for Aligned Nanowire Arrays" Angewandte Chemie—International Edition; May 6, 2005; v. 44, no. 19, p. 2925-2929, which is fully incorporated herein by reference. Such embodiments may involve, for example, selecting a temperature at which to grow Germanium nanowires via CVD from gold nanoclusters, relative to the diameter of the nanoclusters as set via patterned opening size and angle of deposition of gold material used in forming the nanoclusters.

Figure 4:
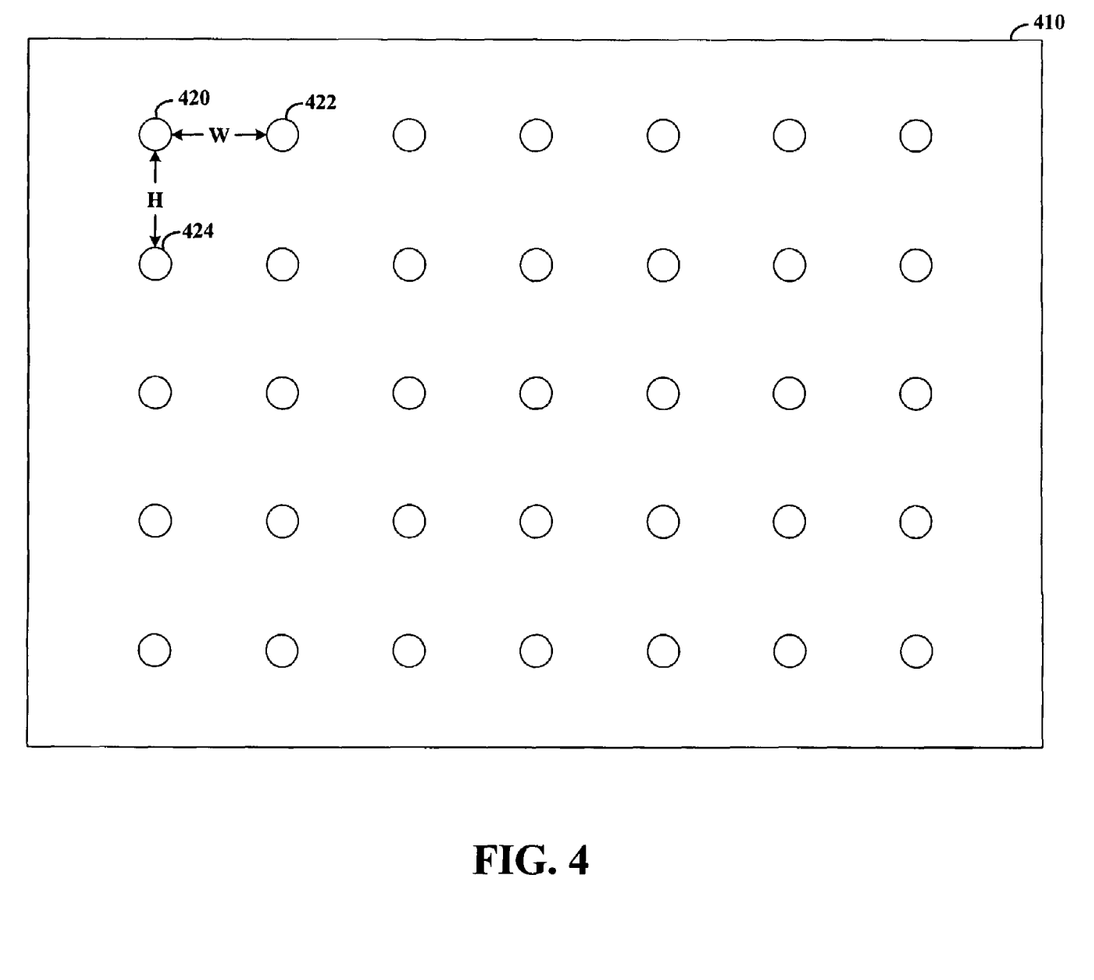
FIG. 4 shows a top view of an array of metallic nanoclusters on a substrate at openings of a photoresist mask, according to another example embodiment of the present invention.

FIG. 4 shows a top view of an array of metallic nanoclusters formed on a substrate 410 at openings of a photoresist mask, according to another example embodiment of the present invention. Metallic nanoclusters 420, 422 and 424 are labeled for reference purposes. Here, the array of metallic nanoclusters is formed in a generally regular pattern of rows (shown horizontally) and columns (shown vertically), with each row separated by a dimension "H" and each column separated by a dimension "W," respectively shown between metallic nanoclusters 420 and 424, and 420 and 422.

The dimensions "H" and "W" relate to a distance, or pitch, between adjacent metallic nanoclusters, and are respectively chosen to facilitate the particular application for which the metallic nanoclusters are formed. Where lithography approaches are implemented as described above, the distance between adjacent wells or openings (e.g., see openings 122, 124 and 126 in FIG. 1A) define the pitch, such as when patterning PMMA wells using nanoimprint lithography. In some applications, the pitch between the metallic nanoclusters clusters is about 75 nm, and in other applications, is less than about 50 nm.

As discussed above with FIG. 3, an array of nanotubes can be grown from an array of catalyst nanoparticles as shown in FIG. 4. Where used for nanotube growth, growth locations on the substrate 410 is controlled for each nanotube via the placement of the catalyst nanoclusters. In some applications, similar catalyst particles are used as the metallic nanoclusters in FIG. 4, to facilitate monodisperse growth of single-walled carbon nanotubes, such as the nanotube 350 shown in FIG. 3, at each metallic nanocluster.

The nanoclusters and, where used to grow nanotubes, the nanotubes can be implemented in one or more of a variety of applications. In one example embodiment, an array of carbon nanotubes as described above in connection with FIGS. 3 and 4 is grown for nanotube electronics applications. The band gap is governed by the tube diameter, which is selectively controlled via control of the diameter of the metallic catalyst nanoclusters from which the carbon nanotubes are grown. Once such electrical application involves a field emission device. Other electrical applications involve the formation of nanotube-based wires or the formation of a nanotube-based transistors; in the latter application, the nanotube is used as a semiconductor material with band gap characteristics selected via the control of the nanotube diameter. Other applications, electrical and otherwise, range from catalysis (including that for the growth of nanotubes as described herein), surface science, single-molecule spectroscopy and data storage; in various example embodiments, such applications are selectively implanted using one or more of the approaches described in the references listed below.

REFERENCES

The following references describe approaches that, in some example embodiments, are implemented in connection with one or more of the approaches described herein. Moreover, the various example embodiments described above in connection with nanoclusters, nanotubes or other applications are selectively implemented with one or more of the approaches described in the references below, such as for surface science applications, nanotube applications and others. Each of the following are fully incorporated herein by reference.

(1) Chopra, K. L. *Thin Film Phenomena*; McGraw-Hill: New York, 1969.
(2) Yang, M. X.; Gracias, D. H.; Jacobs, P. W.; Somorjai, G. A. *Langmuir* 1998, 14, 1458.
(3) Wang, D.; Tu, R.; Zhang, L.; Dai, H. *Angew. Chem., Int. Ed.* 2005, 44, 2925.
(4) Cui, Y.; Bjork, M. T.; Liddle, J. A.; Sonnichsen, C.; Boussert, B.; Alivisatos, A. P. *Nano Lett.* 2004, 4, 1093.
(5) Mikrajuddin; Iskandar, F.; Okuyama, K. *AdV. Mater.* 2002, 14, 930.
(6) Qin, D.; Xia, Y. N.; Xu, B.; Yang, H.; Zhu, C.; Whitesides, G. M. *AdV. Mater.* 1999, 11, 1433.
(7) Yan, X. M.; Kwon, S.; Contreras, A. M.; Bokor, J.; Somorjai, G. A. *Nano Lett.* 2005, 5, 745.
(8) Dai, H. *Surf. Sci.* 2002, 500, 218.
(9) Jensen, P.; Baraba'si, A. L.; Larralde, H.; Havlin, S.; Stanley, H. E. *Phys. ReV. B* 1994, 50, 1994.
(10) Philipp, G.; Weimann, T.; Hinze, P.; Burghard, M.; Weis, J. *Microelectron. Eng.* 1999, 46, 157.
(11) Maruyama, S.; Kojima, R.; Miyauchi, Y.; Chiashi, S.; Kohno, M. *Chem. Phys. Lett.* 2002, 360, 229.
(12) Li, Y. M.; Mann, D.; Rolandi, M.; Kim, W.; Ural, A.; Hung, S.; Javey, A.; Cao, J.; Wang, D. W.; Yenilmez, E.; Wang, Q.; Gibbons, J. F.; Nishi, Y.; Dai, H. J. *Nano Lett.* 2004, 4, 317.
(13) Chou, S. Y.; Krauss, P. R.; Renstrom, P. J. *Science* 1996, 272, 85.
(14) Quake, S. R.; Scherer, A. *Science* 2000, 290, 1536.
(15) Hua, F.; Sun, Y. G.; Gaur, A.; Meitl, M. A.; Bilhaut, L.; Rotkina, L.; Wang, J. F.; Geil, P.; Shim, M.; Rogers, J. A.; Shim, A. *Nano Lett.* 2004, 4, 2467.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For instance, such changes may include modifying the nanostructures for selected applications or altering the arrangement and orientation of the nanostructures. Other changes relating to nanotube growth may include modifying the nanotubes for selected applications, altering the arrangement and orientation of the nanotubes, and where appropriate, using SWNTs as building blocks for more complex devices, such as MWNTs. Furthermore, the nanotubes may include materials other than carbon, such as silicon and/or boron, which also may be grown using a catalyst nanocluster approach similar to that described above. Such modifications and changes do not depart from the true spirit and scope of the present invention, including that set forth in the following claims.

What is claimed is:

1. A method for forming an array of nanostructures, the method comprising:
   forming a masking layer on a substrate;
   patterning an array of openings in the masking layer to expose the substrate below the masking layer;
   depositing a layer of metallic material on the exposed substrate at each opening;
   annealing the metallic layer to form metallic nanoclusters at each opening, each nanocluster having a cross-sectional dimension that is on an order of magnitude less than the lateral dimension of the opening in which the nanocluster is formed; and
   growing an array of nanostructures from the metallic nanoclusters.

2. The method of claim 1, wherein patterning openings in the masking layer includes patterning openings in the masking layer having a diameter of about 20 nm, wherein annealing the metallic layer to form metallic nanoclusters at each opening includes forming metallic nanoclusters having a diameter of less than 2 nm.

3. The method of claim 1, wherein patterning openings in the masking layer includes patterning openings having a lateral dimension determined as a function of a number of nanoclusters to be formed at the opening.

4. The method of claim 1, wherein the substrate includes material that facilitates finite mobility and diffusion of atoms of the metallic material during the annealing, and wherein annealing the metallic layer to form metallic nanoclusters includes irreversibly coupling dispersed metal atoms of the metallic material via metal-metal interactions to form metallic nanoclusters.

5. The method of claim 1, wherein depositing a layer of metallic material includes evaporating a layer of metallic material at an angle, using the mask to mask a portion of the exposed substrate at each opening, to form metallic material that covers less than all of the exposed substrate at each opening.

6. The method of claim 1, wherein forming a masking layer on a substrate includes forming a masking layer to a selected mask height, wherein depositing a layer of metallic material includes depositing the layer of metallic material at an angle of deposition selected, relative to the mask height, to form a metallic layer at each opening having a lateral dimension determined by the mask height and the angle of deposition.

7. The method of claim 1, wherein growing nanostructures from the metallic nanoclusters includes growing at least one of: a nanotube and a nanowire.

8. The method of claim 1, further including
   selecting a number of metallic nanoclusters to be formed at each opening,
   responsive to the selected number of metallic nanoclusters, selecting a lateral dimension of the layer of metallic material to be formed at each opening, and
   wherein depositing a layer of metallic material includes depositing the layer of metallic material to the selected lateral dimension.

9. The method of claim 8, wherein depositing the layer of metallic material to the selected lateral dimension includes evaporating a metallic material at an angle of deposition relative to the substrate to form a layer of metallic material.

10. The method of claim 1, further including
selecting a cross-sectional dimension of metallic nanoclusters to be formed at each opening,
responsive to the selected cross-sectional dimension at each opening, selecting a thickness of the layer of metallic material to be formed therein, and
wherein depositing a layer of metallic material on the exposed substrate includes depositing the layer of metallic material to the selected thickness.

11. The method of claim 1, wherein patterning openings in the masking layer and depositing a layer of metallic material on the exposed substrate include patterning openings to a selected lateral dimension and depositing a layer of metallic material to a selected height to respectively set the number and cross-sectional thickness of metallic nanoclusters to be formed at each opening.

12. The method of claim 1, wherein depositing a layer of metallic material includes depositing less than about 500 atoms of metallic material at each opening to a lateral dimension of about 20 nm, and wherein annealing the metallic layer to form metallic nanoclusters at each opening includes annealing the metallic layer to form metallic nanoclusters having a cross-sectional dimension of about 2 nm.

13. The method of claim 1, wherein patterning openings in the masking layer includes patterning adjacent openings having a diameter of about 20 nm and spaced at a distance of less than about 50 nm.

14. A method for growing an array of nanostructures, the method comprising:
selecting a number and diameter of nanoclusters to form at each of a plurality of nanocluster sites for growing nanostructures thereat;
forming a masking layer on a substrate;
patterning an array of wells in the masking layer to expose the substrate below, each opening having a diameter determined as a function of the selected number of nanoclusters to be formed at the opening;
depositing a layer of metallic material on a portion of the exposed substrate at each well, using the masking layer with an angle of deposition to selectively mask a portion of the exposed substrate at each well;
removing the masking layer;
annealing the metallic layer to form metallic nanoclusters; and
growing nanostructures at the metallic nanoclusters.

15. The method of claim 14, wherein patterning wells in the masking layer includes patterning wells to a diameter of less than about 50 nm, and wherein annealing the metallic layer to form metallic nanoclusters includes forming metallic nanoclusters having a diameter that is on an order of magnitude less than the diameter of the wells.

16. The method of claim 14, wherein patterning wells in the masking layer includes patterning wells to a diameter of less than about 20 nm, and wherein annealing the metallic layer to form metallic nanoclusters includes forming metallic nanoclusters having a diameter that is less than about 2 nm.

17. The method of claim 14, wherein growing nanostructures at the metallic nanoclusters includes using the metallic catalyst nanoclusters to catalyze the growth of a nanostructure thereat.

18. The method of claim 14, wherein depositing a layer of metallic material includes depositing a layer of metallic material having a thickness determined as a function of the diameter of nanoclusters to be formed at each opening.

19. The method of claim 14, wherein patterning an array of wells includes patterning an array of wells, each well having a diameter that is less than the metal atom diffusion length of the metallic material, and wherein annealing the metallic layer to form metallic nanoclusters includes forming one nanocluster per well.

20. A method for manufacturing nanoclusters, the method comprising:
depositing a layer of metallic material at nanocluster sites defined on a substrate, using a mask over the substrate and an angle of deposition of the metallic material to define a lateral dimension of the metallic material layer; and
annealing the nanomaterial layer to form, at each nanocluster site, at least one nanocluster having a diameter that is an order of magnitude smaller than the defined lateral dimension of the metallic material layer.

* * * * *